United States Patent [19]

Carey et al.

[11] Patent Number: 4,829,242
[45] Date of Patent: May 9, 1989

[54] MULTIGIGAHERTZ PROBE

[75] Inventors: David H. Carey, Austin, Tex.; Roger B. Jennings, New York, N.Y.

[73] Assignee: Microelectronics and Computer Technology Corporation, Austin, Tex.

[21] Appl. No.: 129,495

[22] Filed: Dec. 7, 1987

[51] Int. Cl.[4] ............................................. G01R 31/00
[52] U.S. Cl. ................................. 324/158 P; 324/72.5; 324/73 PC; 174/35 GC; 339/108 TP
[58] Field of Search ............... 324/158 P, 72.5, 158 F, 324/73 PC; 174/35 GC; 439/482 339/108 TP

[56] References Cited

U.S. PATENT DOCUMENTS

| 4,055,805 | 10/1977 | Ardezzone | 324/72.5 |
| 4,686,463 | 8/1987 | Logan | 324/72.5 |
| 4,697,143 | 9/1987 | Lockwood | 324/73 PC |
| 4,727,319 | 2/1988 | Shahriary | 324/72.5 |

Primary Examiner—Michael J. Tokar
Attorney, Agent, or Firm—Fulbright & Jaworski

[57] ABSTRACT

A multigigahertz probe for testing electrical micro connections or wafers. A body has a top, bottom and a testing tip at one end, and the one end slants upwardly and inwardly from the bottom towards the top. At least one coaxial cable is carried by the body and includes a first connector end and a second testing end forming testing contacts. The testing end extends to the intersection of the bottom and the slanting one end of the body.

8 Claims, 4 Drawing Sheets

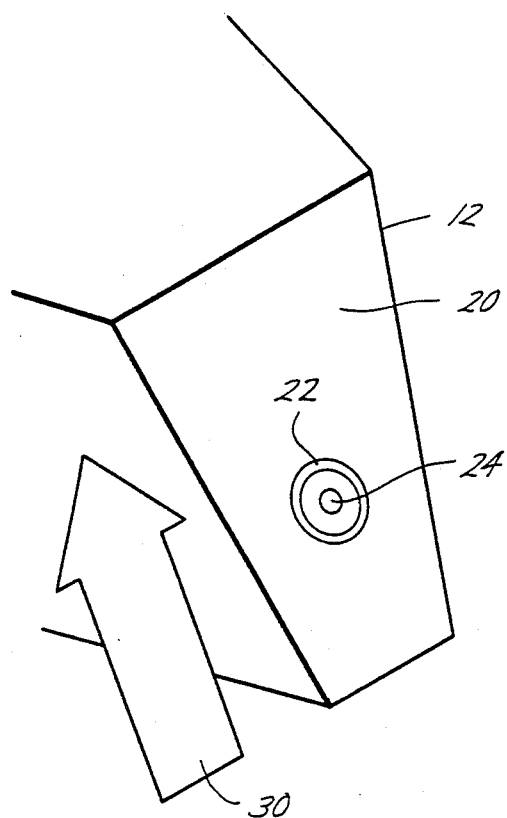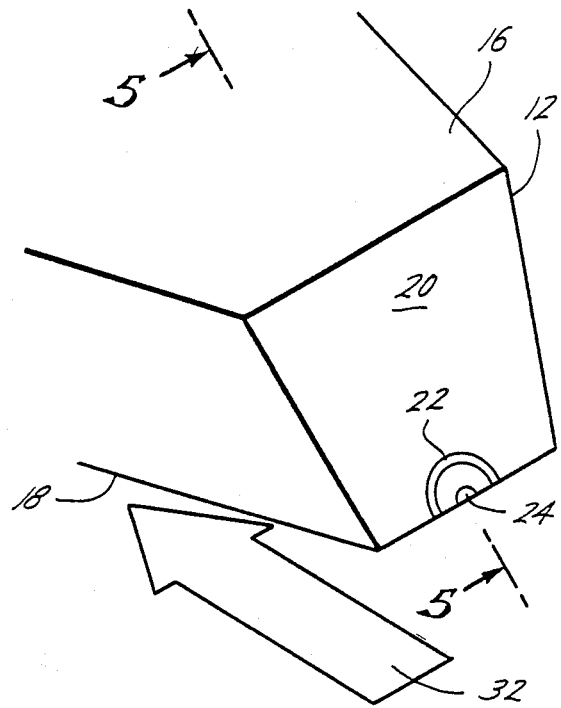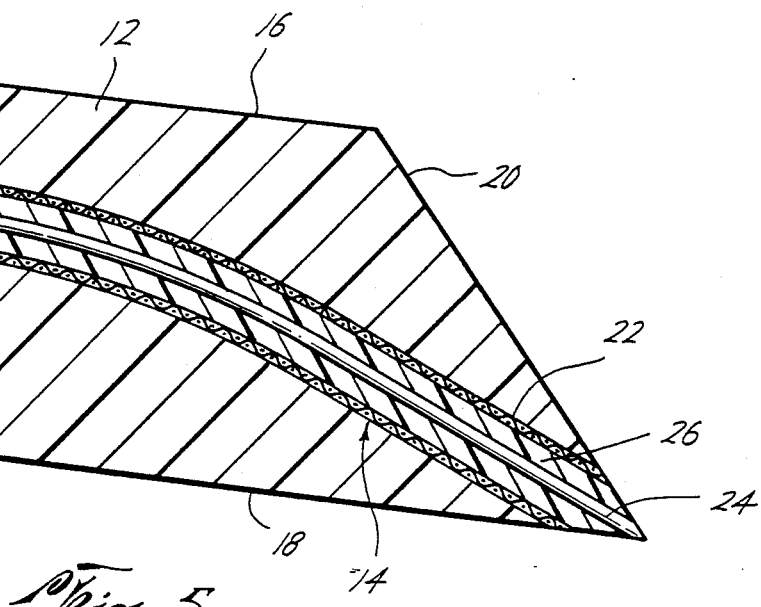

MULTIGIGAHERTZ PROBE

BACKGROUND OF THE INVENTION

A multigigahertz probe is used as a wafer probe for microwave frequencies for performing on wafer measurements of electrical components such as transistors and integrated circuits.

A probe sold by Cascade Microtech performs well in the transmission of test signals. However, the probe tip's contact surfaces are attached to a thin ceramic support which is stiff and fragile. This inhibits the probe's ability to conform to surface irregularties in the wafer and the tip may be easily broken. The probe uses coplanar wave guide transmission lines which are typically sensitive to geometry variations and is expensive to manufacture.

The present invention is directed to a Probe which is compliant and can withstand small deflections and impacts without breaking and can conform and make good contact with slightly irregular pad heights and which is inexpensive. The present probe utilizes a micro-coaxial cable or cables with simple non-lithographic fabrication techniques to create a probe with pads (signal/ground) with good high frequency performance.

SUMMARY

The present invention is directed to a multigigahertz probe for testing electrical microconnections on wafers and includes a body having a top, bottom and testing tip at one end in which the one end slants upwardly and inwardly from the bottom towards the top. At least one coaxial cable is carried by the body and has a first connector end and a second testing end. The testing end extends to the intersection of the bottom and the slanting one end of the body for engaging contacts on a wafer and performing tests of the electrical components on the wafer.

Still a further object is wherein the coaxial cable includes a circular shield and a center conductor forming testing contacts positioned at the intersection of the bottom and the slanting one end of the body.

Yet a still further object of the present invention is wherein the testing end of the coaxial cable substantially forms a half circle on the slanting one end of the body.

Still a further object of the present invention is wherein the body is formed from a material consisting of thermosetting polymers, thermoplastic polymers and elastomers. Preferably, the body is a polyester resin.

Still a further object of the present invention is wherein a gold contact is electroformed on the ends of the center conductor and the shield.

Yet a still further object of the present invention is wherein the length of the coaxial cable is short enough to satisfy the maximum percent rise time degradation and maximum reflective losses.

Yet a still further object of the present invention is wherein the plane of the slanting end is approximately 35° from the plane of the bottom for optimizing the cable profile.

Still a further object of the present invention is wherein the tip of the probe has at least two mils of deflection under a probe load of 10 grams of force.

Other and further objects, features and advantages will be apparent from the following description of presently preferred embodiments of the invention, given for the purpose of disclosure and taken in conjunction with the accompanying drawings.

BRIEF DESCRIPTION OF THE DRAWINGS

FIG. 3 is a fragmentary, perspective view of one step in the process of manufacturing the probe, FIG. 4 is a fragmentary, perspective view illustrating another step of manufacturing the probe of the present invention, FIG. 5 is a cross-sectional view, taken along the line 5—5, of FIG. 4.

DESCRIPTION OF THE PREFERRED EMBODIMENT

Figure 1:
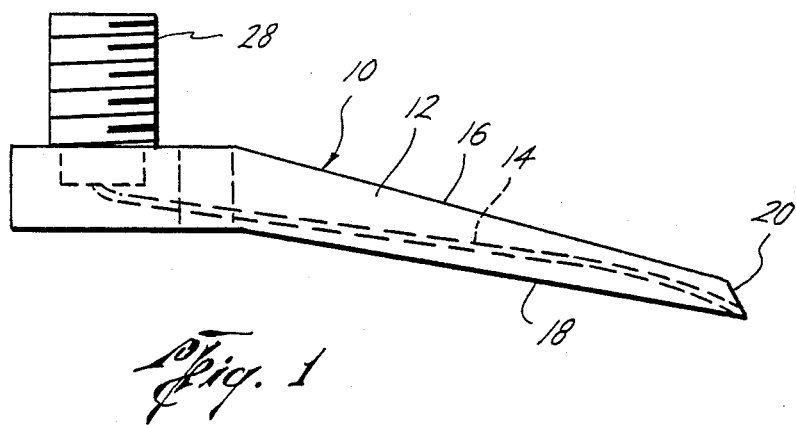
FIG. 1 is an elevational side view of the probe of the present invention.
Figure 2:
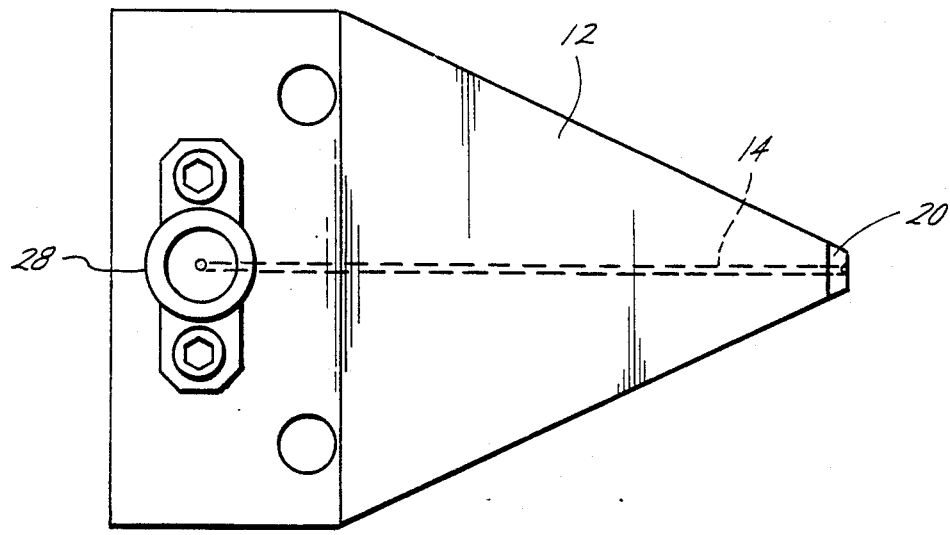
FIG. 2 is an elevational top view of the probe of FIG. 1.

Referring now to the drawings, and particularly to FIGS. 1, 2, 4, 5 and 6, the reference numeral 10 generally indicates the probe of the present invention and generally includes a body 12 and at least one coaxial cable 14.

The body 12 includes a top 16, a bottom 18, a tip 20 at one end, in which said one end 20 slants upwardly and inwardly from the bottom 18 towards the top 16.

The coaxial cable 14 includes a circular outer shield 22 and a center conductor 24 which are separated by an insulation 26 such as a plastic sold under the trade name Teflon. The coaxial cable 14 has a first end connected to a connector 28 and a second testing end extending to the intersection of the bottom 18 and the slanting one end 20. The probe 10 carries a test signal through the middle conductor 24 and one ground signal through the circular shield 22.

The probe 10 is used for microwave frequencies for on wafer measurements of electrical components such as transistors and integrated circuits in which a standard SMA connector 28 is connected to a time domain reflectometer (TDR) such as a Tekronix 7854 TDR with a S-52 generating head and a Hewlett-Packard 8510 network analyzer. The SMA connector 28 may be connected perpendicularly or in line with the connector end of the Coaxial cable 14, here shown as being perpendicular. This requires that the multigigahertz signal is taken from the testing instrument which uses the standard SMA connector's 70 mil centers to the probe testing end in which the spacing between the circular shield 22 and the center conductor 24 may be quite small, for example, 4.0 mils. The micro-coaxial cable 14 provides the means of achieving this reduction in the transmission line size. The advantages of micro-coaxial cables are: (1) micro-coaxial cables are relatively inexpensive, (2) such cables are available with SMA connections preattached, (3) coaxial cables maintain a good transmission line environment up to the point of contact, (4) micro-coaxial cables may be tuned to give the best transmission line response, (5) such cables have frequency carrying capacities in the multigigahertz range for short lengths, and (6) a design which joins several of these cables together would be highly extendable. Coaxial cables, suitable for small probes, in the range of 0.008 and 0.141 inches in diameter are available. One satisfactory cable used in the present probe 10 which was 13 mils in diameter was that sold by Micro-Coax Inc. as model UT-13. However, in satisfying the desired maximum percent of rise time degradation required and the maximum reflective losses, it was found that the coaxial cable 14 should be no longer than one inch based on cable sample tests. Of course, longer lengths could be used in other applications. The overall length of the probe was set at 0.6 inches as the extra 0.4 inches of cable was needed for the SMA connector 28. In addition, the coaxial cable can maintain the required 50 ohm transmission line environment up to the point of contact in order to meet the performance specifications.

In determining what material would be suitable for the body 12 for supporting the coaxial cable 14, the criteria was based upon its moldability, durability and flexibility. Plastics and rubbers were considered for their good dielectric properties and strengths. While thermosetting resins, thermoplastic polymers and elastomers are satisfactory, polyester resin 32-032 sold under the trademark Polylite was chosen as polyester resin can be easily cast and is low in cost. The plastic body is easily machined and clear which allows for the non-destructive observation of the embedded cable 14 and the placement of the cable 14 can be easily controlled. Probes 10 were manufactured in which the mold was first spread with dry mold release agent and the cables were clamped down to insure that they remained in place. Polyester resin was mixed with hardener (one part hardener/100 parts resin) and poured into the mold and allowed to set in an oven at 200° for thirty minutes. The material for the body 12 was selected to provide that the tip of the probe 10 should experience at least two mils of deflection when applied with a load of 10 grams of force in order to insure good contact with the test pads and to accommodate slightly irregular test pad heights. As one example, the probe body 12 using cast polyester resin 32-032 had a thickness of approximately 0.04 inches, a length of approximately 0.5 inches, a width of 0.25 inches, a tip deflection of 0.00209 inches with a load of ten grams and the bottom 18 had an angle of approximately 11° to the horizontal.

In grinding the slant end 20 and bottom 18, it was noted that a small ball of material would form on the end in the grinding direction which would cause problems. The procedure which yielded the best result took two steps. First, the slanted end 20 of the probe, as best seen in FIG. 3, was ground upwardly as indicated by the directional arrow 30 with course sand paper followed by fine sand paper. Then the bottom 18 of the probe was ground as indicated in the directional arrow 32 in FIG. 4 with the course paper again moving away from the edge. The grinding divided the cable in half as best seen in FIGS. 4 and 5 wherein the testing end of the coaxial cable substantially forms a half circle on the slanting end 20 of the body 12. This allowed the ground and signal contacts on the shield 22 and conductor 24 to be aligned on a wafer through the use of an optical microscope. That is, the contacts 22 and 24 are then visible for making contact with pads below the probe 10. The angle of the slanting end 20 relative to the bottom 18 was optimized. If the angle with respect to the bottom surface 18 of the probe was too small, a large amount of the center conductor 24 would be exposed. On the other hand, if the angle was too large, the profile of the cable 14 would become more circular thus bringing the grounded outer shield 22 closer to the center conductor 24. The grounding outer shield 22 would then get close enough to the center conductor to risk contacting more than one testing pad at a time thereby short circuiting the device under test. Both an optimum cable profile and reduced separation occurred at an angle of approximately 35°. Again, other angles could be used in other applications.

Figure 6:
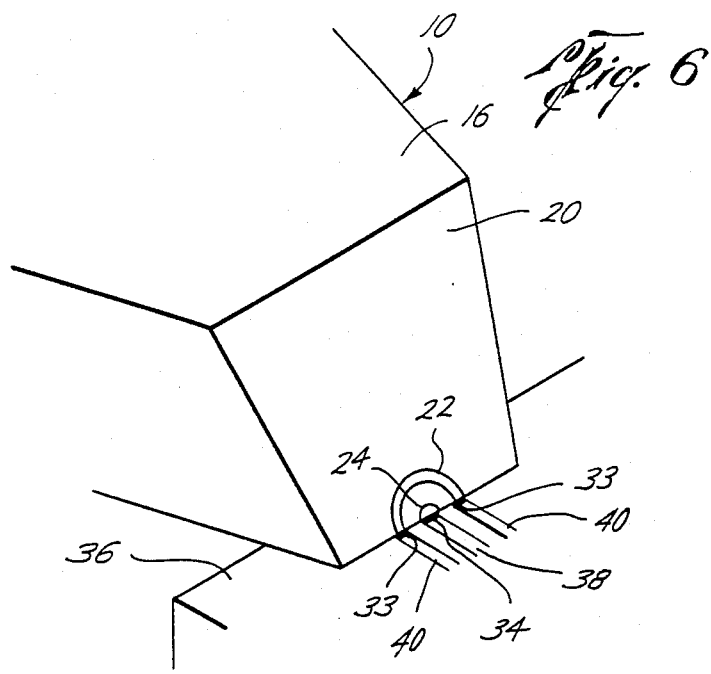
FIG. 6 is a fragmentary, perspective view of one embodiment of the present invention with a single coaxial cable in testing position.
Figure 7:
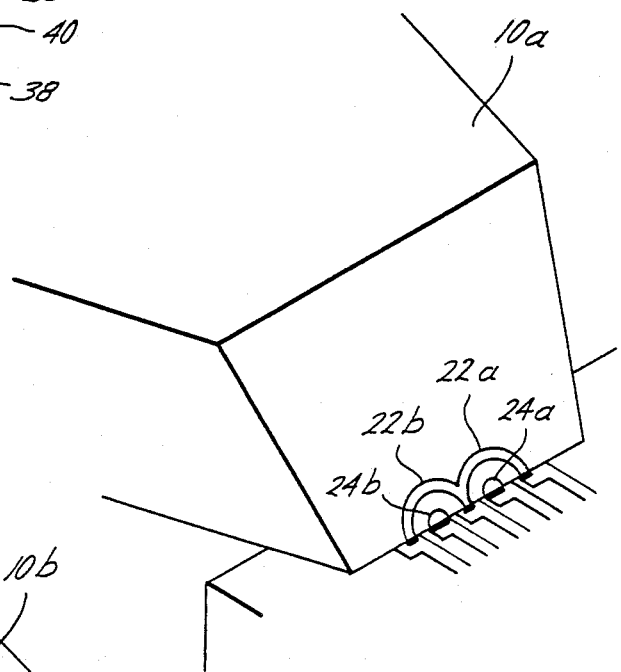
FIG. 7 is a fragmentary, perspective view of an embodiment of the present invention using two coaxial cables.
Figure 8:
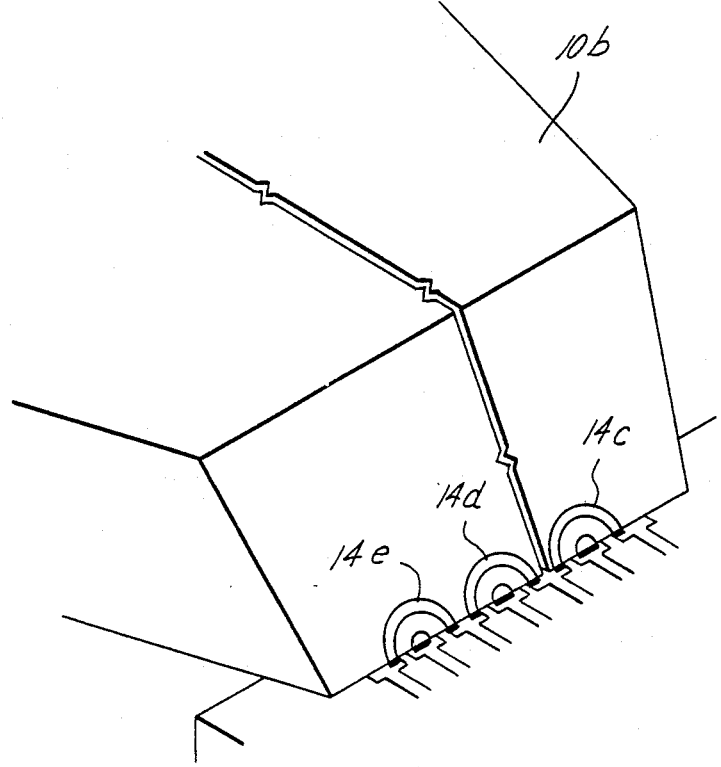
FIG. 8 is a fragmentary, perspective view of an embodiment of the present invention using multiple coaxial cables.

Preferably, noble metal connections are needed for circuit tips to guard against corrosion. For example, as best seen in FIG. 6, gold tips 32 are connected to the shield 22 and gold tip 34 is connected to the center conductor 24. While the gold contact forming may be performed by any suitable process, electroforming was found to be satisfactory. This process requires no special machinery, the materials needed are readily available and inexpensive, the contacts which are electroformed adhere well to a copper substrate, and the atom-by-atom deposition produces pad heights with great accuracy. As shown in FIG. 6, the probe 10 is in position on a test wafer 36 having a signal line 38 which is placed in contact with the center conductor 24 and ground leads 40 which are placed in contact with the ground shield 22. However, as best seen in FIGS. 7 and 8, the probe can be provided with additional coaxial cables to provide a multitude of test points. Thus, in FIG. 7, the probe 10a includes two coaxial cables. The first cable 22a has an outer ground shield 22a and an inner center conductor 24a while the second coaxial cable has an outer ground shield 22b and an inner center conductor 24b. And as best seen in FIG. 8, a probe 10b is provided having a plurality of coaxial cables 14c, 14d and 14e.

As previously described, prior art probes were very stiff and fragile and the excessive stiffness inhibited the probe's ability to conform to slight surface irregularites in the wafer, making complete contact difficult. The probe 10 is more compliant and can withstand small deflections and impacts without breaking and is able to conform and make good contact with slightly irregular pad heights. Both the type of material used for the body 12 and the structure of the coaxial cable 14 act to provide these advantages.

Figure 9:
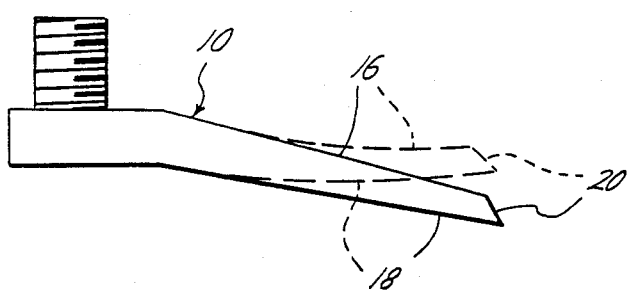
FIG. 9 is an elevational view of the present invention illustrating the deflection of the tip.
Figure 10:
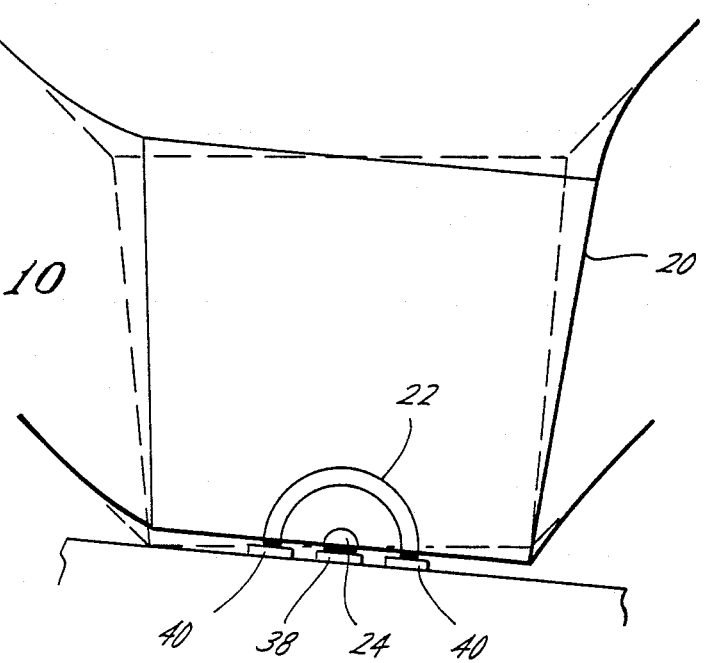
FIG. 10 is a fragmentary, enlarged elevational view of the tip of the invention showing it deflection in making contact with unlevel pads.

FIG. 9 illustrates the deflection of the tip end 20 in an upward and downward direction for allowing the testing end to be moved into and out of contact with a testing wafer without damage. It is to be noted that this flexing provides an advantageous wiping action for cleaning the contacts. FIG. 10 illustrates the ability of the probe 10 to make good contact with testing pads in which the testing pads are in a plane at an angle to the plane of the bottom of the probe 10.

Figure 11:
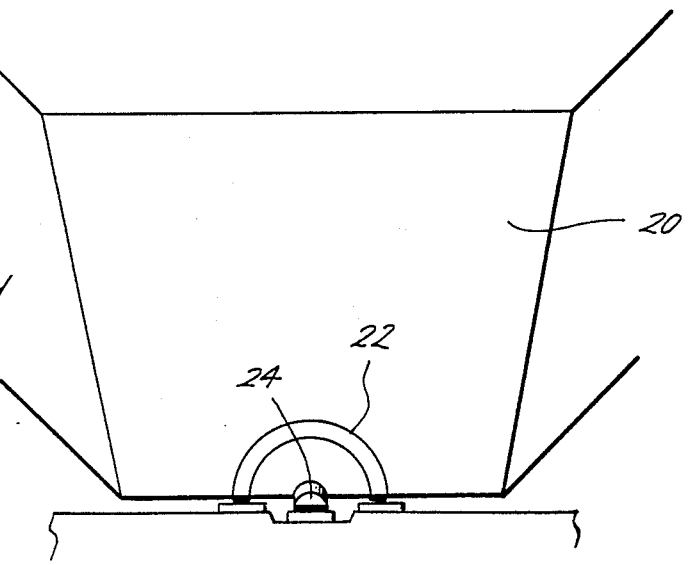
FIG. 11 is a fragmentary, enlarged elevational view illustrating the deflection of the center conductor of the cable at the signal contact.

FIG. 11 illustrates the ability of the center conductor 24, which has been present downwardly a slight amount, to make contact with an offset testing pad.

Two series of tests were performed on the probe 10. The probe's electrical performance and contact characteristics were determined by testing the probe in air and on a testing substrate. A first set of measurements was taken without contacting a wafer substrate. The probe was mounted on the end of a 50 ohm air line and pulsed with a 55 ps step input. A 1.8% Trd and 1.75 Db reflection losses at 20 GHz were observed for a signal degradation by the probe 10.

The present invention, therefore, is well adapted to carry out the objects and attain the ends and advantages mentioned as well as others inherent therein. While presently preferred embodiments of the invention have been given for the purpose of disclosure, numerous changes in the details of construction and arrangement of parts will be readily apparent to those skilled in the art and which are encompassed within the spirit of the invention and the scope of the appended claims.

What is claimed is:

1. A multigigahertz probe for testing electrical micro connections on wafers comprising,
    a body having a top, bottom and a testing tip at one end, said one end slanting upwardly and inwardly from the bottom towards the top,
    at least one coaxial cable carried by the body and having a first connector end and a second testing end, said coaxial cable includes a circular shield and a center conductor forming testing contacts at the testing end,
    said testing end extending to the intersection of the bottom and the slanting one end of the body, wherein the testing end of the coaxial cable substantially forms a half circle on said slanting one end of the body.

2. The apparatus of claim 1 wherein the body is formed from a material consisting of thermosetting polymers, thermoplastic polymers and elastomers.

3. The apparatus of claim 1 wherein a gold contact is electroformed on the testing end of the center conductor and the shield.

4. The apparatus of claim 1 wherein the length of the coaxial cable is substantially no longer than one inch.

5. The apparatus of claim 1 wherein the plane of the slanting end is approximately thirty five degrees from the plane of the bottom.

6. The apparatus of claim 1 wherein the body is a polyester resin.

7. The apparatus of claim 1 wherein the testing end of the probe has at least two mils of deflection under a probe load of ten grams of force.

8. The apparatus of claim 1 wherein said body is of a material that is deformable and compliant for allowing the testing contacts to conform and make good contact with irregular connections on wafers.

* * * * *